(12) United States Patent
Park et al.

(10) Patent No.: US 8,649,204 B2
(45) Date of Patent: Feb. 11, 2014

(54) RESISTIVE MEMORY DEVICES AND MEMORY SYSTEMS HAVING THE SAME

(75) Inventors: Joon Min Park, Seoul (KR); Kwang Jin Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 106 days.

(21) Appl. No.: 13/364,942

(22) Filed: Feb. 2, 2012

(65) Prior Publication Data
US 2012/0307547 A1 Dec. 6, 2012

(30) Foreign Application Priority Data
May 30, 2011 (KR) .......................... 10-2011-0051094

(51) Int. Cl.
*G11C 11/00* (2006.01)
(52) U.S. Cl.
USPC ......................................................... 365/148
(58) Field of Classification Search
USPC ......................................................... 365/148
See application file for complete search history.

(56) References Cited

U.S. PATENT DOCUMENTS

| 7,254,055 | B2 | 8/2007 | Cho et al. |
| 7,327,602 | B2 | 2/2008 | Kostylev et al. |
| 7,349,246 | B2 | 3/2008 | Cho et al. |
| 7,580,278 | B2 | 8/2009 | Cho et al. |
| 7,606,064 | B2 | 10/2009 | Jeong et al. |
| 7,746,688 | B2 | 6/2010 | Kim et al. |
| 7,889,548 | B2 | 2/2011 | Jeong et al. |
| 2008/0137401 | A1* | 6/2008 | Philipp et al. ................. 365/163 |
| 2008/0298120 | A1* | 12/2008 | Chow et al. .................... 365/163 |
| 2009/0310401 | A1* | 12/2009 | Philipp et al. ................. 365/163 |
| 2010/0027327 | A1 | 2/2010 | Chung et al. |
| 2010/0237314 | A1* | 9/2010 | Tsukamoto et al. .............. 257/3 |
| 2012/0039132 | A1* | 2/2012 | Min et al. ................. 365/189.04 |

FOREIGN PATENT DOCUMENTS

| KR | 1020050025730 A | 3/2005 |
| KR | 100781550 B1 | 11/2007 |
| KR | 1020090097726 A | 9/2009 |

* cited by examiner

*Primary Examiner* — Hoai V Ho
*Assistant Examiner* — Pablo Huerta
(74) *Attorney, Agent, or Firm* — Myers Bigel Sibley & Sajovec, P.A.

(57) ABSTRACT

A nonvolatile memory device includes an array of resistive memory cells and a write driver, which is configured to drive a selected bit line in the array with a reset current pulse, which is responsive to a first external voltage input through a first terminal/pad of the memory device during a memory cell reset operation. The write driver is further configured to drive the selected bit line in sequence with a first set current pulse, which is responsive to the first external voltage, and a second set current pulse, which is responsive to a second external voltage input through a second terminal/pad of the memory device during a memory cell set operation.

13 Claims, 15 Drawing Sheets

RESISTIVE MEMORY DEVICES AND MEMORY SYSTEMS HAVING THE SAME

REFERENCE TO PRIORITY APPLICATION

This application claims priority under 35 U.S.C. §119(a) from Korean Patent Application No. 10-2011-0051094, filed May 30, 2011, the disclosure of which is hereby incorporated herein by reference.

FIELD OF THE INVENTION

The present invention relates to integrated circuit memory devices and, more particularly, to nonvolatile memory devices and methods of operating same.

BACKGROUND

The resistance of a memory element within a resistive memory cell changes according to a program current supplied to the memory element. Accordingly, a resistive memory cell stores information by using resistance differences within the memory element as a form of data storage. In the case of a phase change nonvolatile memory, resistance differences occur in response to phase changes within a phase change material used as a memory element. A resistive memory device should typically go through a test prior to a sale (e.g., a firing test or a wafer burn-in test). A voltage or a current higher than a voltage or a current necessary during a normal operation of the resistive memory device is required in the testing phase. Examples of resistive memory devices are disclosed in commonly assigned U.S. Pat. No. 7,580,278 to Cho et al. and US 2010/0027327 to Chung et al., which are hereby incorporated herein by reference.

SUMMARY

Nonvolatile memory devices according to embodiments of the invention include an array of resistive memory cells arranged as a plurality of columns of memory cells electrically coupled to a plurality of bit lines and a plurality of rows of memory cells electrically coupled to a plurality of word lines. A write driver is also provided, which may be electrically connected to the bit lines in the array via a column selection circuit. The write driver is configured to drive a selected one of the plurality of bit lines with a reset current pulse, which is responsive to a first external voltage input through a first terminal/pad of the memory device during a memory cell reset operation. The write driver is further configured to drive the selected one of the plurality of bit lines in sequence with a first set current pulse, which is responsive to the first external voltage, and a second set current pulse, which is responsive to a second external voltage input through a second terminal/pad of the memory device during a memory cell set operation. According to some of these embodiments of the invention, the write driver includes a reset current generator responsive to the first external voltage and a set current generator responsive to the first and second external voltages. A pulse generator may also be provided, which has a first switch connected in series between the first terminal and a first input of the reset current generator, a second switch connected in series between the first terminal and a first input of the set current generator and a third switch connected in series between the second terminal and the first input of the set current generator.

According to additional embodiments of the invention, the pulse generator includes a voltage divider, which is configured to generate a plurality of unequal voltages at respective nodes therein, and a plurality of switches, which are configured to pass the plurality of unequal voltages one-at-a-time to the first input of the set current generator during the memory cell set operation. The plurality of unequal voltages may have magnitudes less than a magnitude of the second external voltage. The plurality of switches may be normally-open switches and the pulse generator may be configured to sequentially close the plurality of switches one-at-a-time during the memory cell set operation. The write driver may also include a current mirror and the reset current generator and the set current generator may be commonly connected to a first node of the current mirror. Moreover, the write driver may be configured to electrically connect a second node of the current mirror to the selected one of the plurality of bit lines during the memory cell reset operation.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
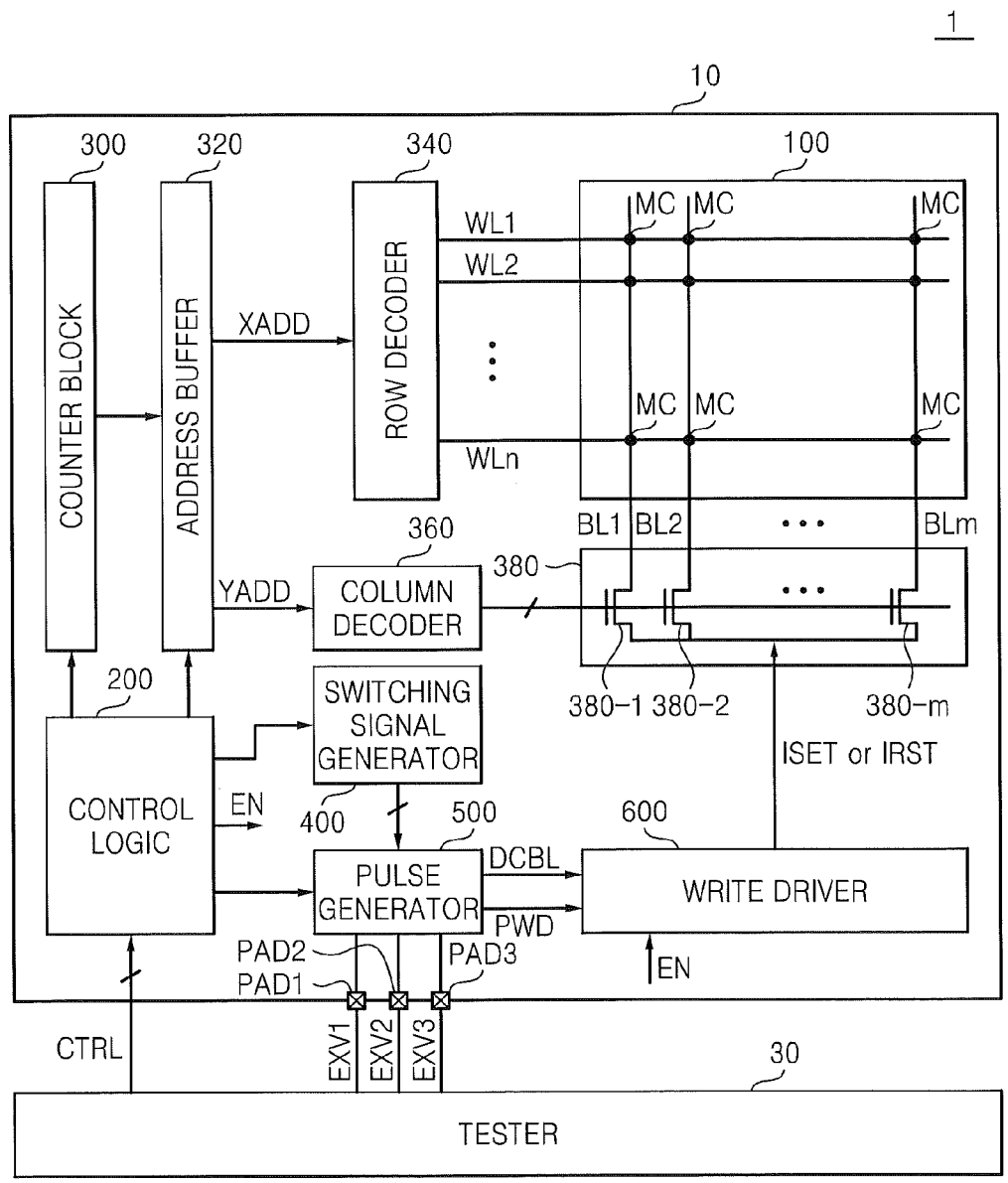
FIG. 1 is a block diagram of a system including a resistive memory device and a tester according to an example embodiment of the present invention.

The present inventive concept now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a system including a resistive memory device and a tester according to an example embodiment of the present invention. Referring to FIG. 1, the system 1 includes the resistive memory device 10 and a tester 30. The resistive memory device 10 includes a memory cell array 100, a control logic 200, a counter block 300, an address buffer 320, a row decoder 340, a column decoder 360, a bit line selection circuit 380, a switching signal generator 400, a pulse generator 500 and a write driver 600, which are connected as illustrated. The memory cell array 100 includes a plurality of bit lines BL1 to BLm, a plurality of word lines WL1 to WLn, and a plurality of resistive memory cells MC. Each of the plurality of resistive memory cells MC may store data by using a phase change material like Ge—Sb—Te (GST) and may include a memory element and a select element. The phase change material can have one of two stable states (i.e., a crystal state and an amorphous state) according to temperature. Thus, the resistive memory cells MC may be treated as phase change memory cells.

The control logic 200 may control an operation of the counter block 300, the address buffer 320, the row decoder 340, the column decoder 360, and the write driver 600 to test each of the plurality of resistive memory cells MC under control of the tester 30 during a test operation. That is, the control logic 200 may control a general operation of the resistive memory device 10. During a test operation, the counter block 300 may output addresses, which are synchronized to an external clock and increase successively, to the address buffer 320. Here, the external clock may be output from the tester 30 and supplied to the counter block 300 through the control logic 200. The counter block 300 may include a plurality of counters.

The row decoder 340 may decode a row address XADD output from the address buffer 320 and supply a word line driving voltage to at least one of a plurality of word lines WL1 to WLn according to the decoding result. That is, the row decoder 340 may select the at least one of the plurality of word lines WL1 to WLn in response to the row address XADD. The column decoder 360 may decode a column address YADD output from the address buffer 320 and generate at least one selection signal for selecting at least one of a plurality of bit lines BL1 to BLm according to the decoding result. The bit line selection circuit 380 controls connection between the memory cell array 100 and the write driver 600 in response to the at least one selection signal output from the column decoder 360. According to an example embodiment, the bit line selection circuit 380 may be included within the column decoder 360. As illustrated by FIG. 1, each of a plurality of selection switches 380-1 to 380-m included in the selection circuit 380 can control connection between each of the plurality of bit lines BL1 to BLm and the write driver 600, in response to each of a plurality of selection signals output from the column decoder 360.

The switching signal generator 400 may output each of a plurality of switching signals for controlling each switching operation of a plurality of switches included in the pulse generator 500. Each of the plurality of switching signals may be generated based on a mode register set (MRS) code. The MRS code may include information relating to a bias voltage DCBL. This information may relate to a voltage level and/or width of the bias voltage DCBL. Accordingly, the switching signal generator 400 or the resistive memory device 10 may further include a mode register for storing the MRS code. The MRS code may be supplied from the tester 30.

The pulse generator 500 generates a program pulse PWD and a bias voltage DCBL in response to control signals generated by the control logic 200 and a plurality of switching signals output from the switching signal generator 400. The program pulse PWD and the bias voltage DCBL are provided to the write driver 600. The program pulse PWD may include a set pulse and a reset pulse. The bias voltage DCBL may include a set bias voltage and a reset bias voltage. For example, during a set operation, the pulse generator 500 generates the set pulse and the set bias voltage. During a reset operation, the pulse generator 500 generates the reset pulse and the reset bias voltage. The write driver 600 supplies a program current (ISET or IRST) to a bit line through the selection circuit 380 in response to a program pulse PWD, a bias voltage DCBL and an enable signal EN. That is, the write driver 600 supplies a set current ISET to the bit line through the selection circuit 380 in response to the set pulse, the set bias voltage and the enable signal EN. Alternatively, the write driver 600 supplies a reset current IRST to the bit line through the selection circuit 380 in response to the reset pulse, the reset bias voltage and the enable signal EN. Here, the enable signal EN is a signal for enabling the write driver 600.

The tester 30 may test each of the plurality of resistive memory cells MC included in the memory cell array 100 of the resistive memory device 10. A test may include a firing test or a wafer burn-in test. The tester 30 supplies each of a plurality of external voltages EXV1, EXV2, and EXV3 to each of a plurality of pads PAD1, PAD2, and PAD3 during a test operation and supplies a plurality of control signals CTRL to the control logic 200 included in the resistive memory device 10.

Figure 2:
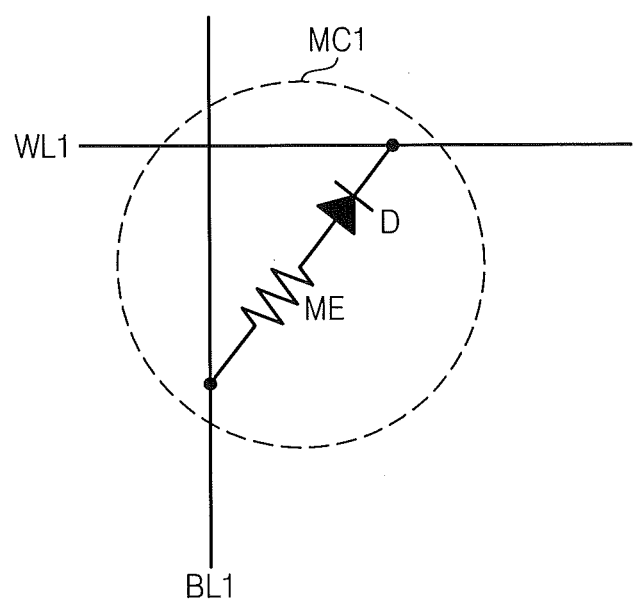
FIG. 2 illustrates an example embodiment of a resistive memory cell illustrated in FIG. 1.

FIG. 2 illustrates an example embodiment of the resistive memory cell illustrated in FIG. 1. Referring to FIGS. 1 and 2, a resistive memory cell MC1 includes a memory element ME and a select element D which are connected in series between a bit line BL1 and a word line WL1. Here, a phase change material is used as the memory element ME and a diode is used as the select element D. As illustrated, an anode of the diode is connected to the memory element ME and a cathode of the diode is connected to the word line WL1. For example, when a voltage difference between the anode and the cathode is higher than a threshold voltage of the diode, the memory element ME of the resistive memory cell MC1 may be supplied with a program current (e.g., a set current ISET or a reset current IRST) through the bit line BL1.

Figure 3:
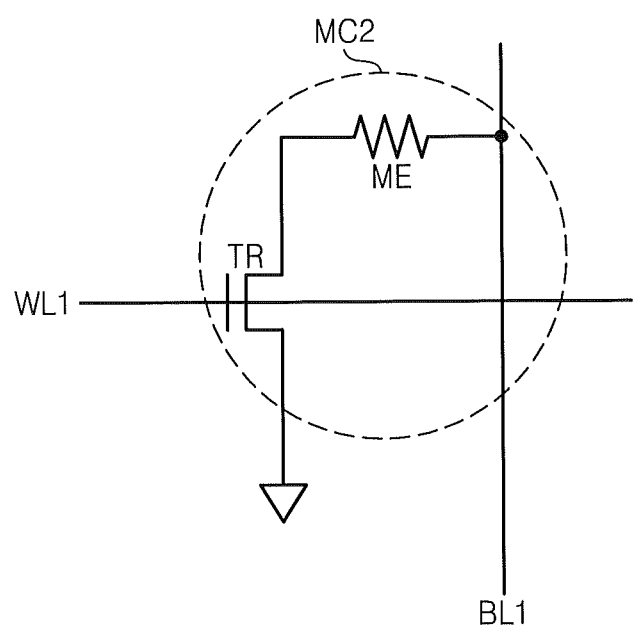
FIG. 3 is another example embodiment of the resistive memory cell illustrated in FIG. 1.

FIG. 3 is another example embodiment of the resistive memory cell illustrated in FIG. 1. Referring to FIGS. 1 and 3, a resistive memory cell MC2 includes a memory element ME and a select element TR, which are connected in series between a bit line BL1 and a power line (e.g., a ground line supplying a ground voltage or a power line supplying a predetermined voltage). Here, a phase change material is used as the memory element ME and a transistor is used as the select element TR. Thus, when a voltage supplied to a word line WL1 is higher than a threshold voltage of the transistor, a memory element ME of the resistive memory cell MC2 may be supplied with a program current (e.g., a set current ISET or a reset current IRST provided through a bit line BL1).

Figure 4:
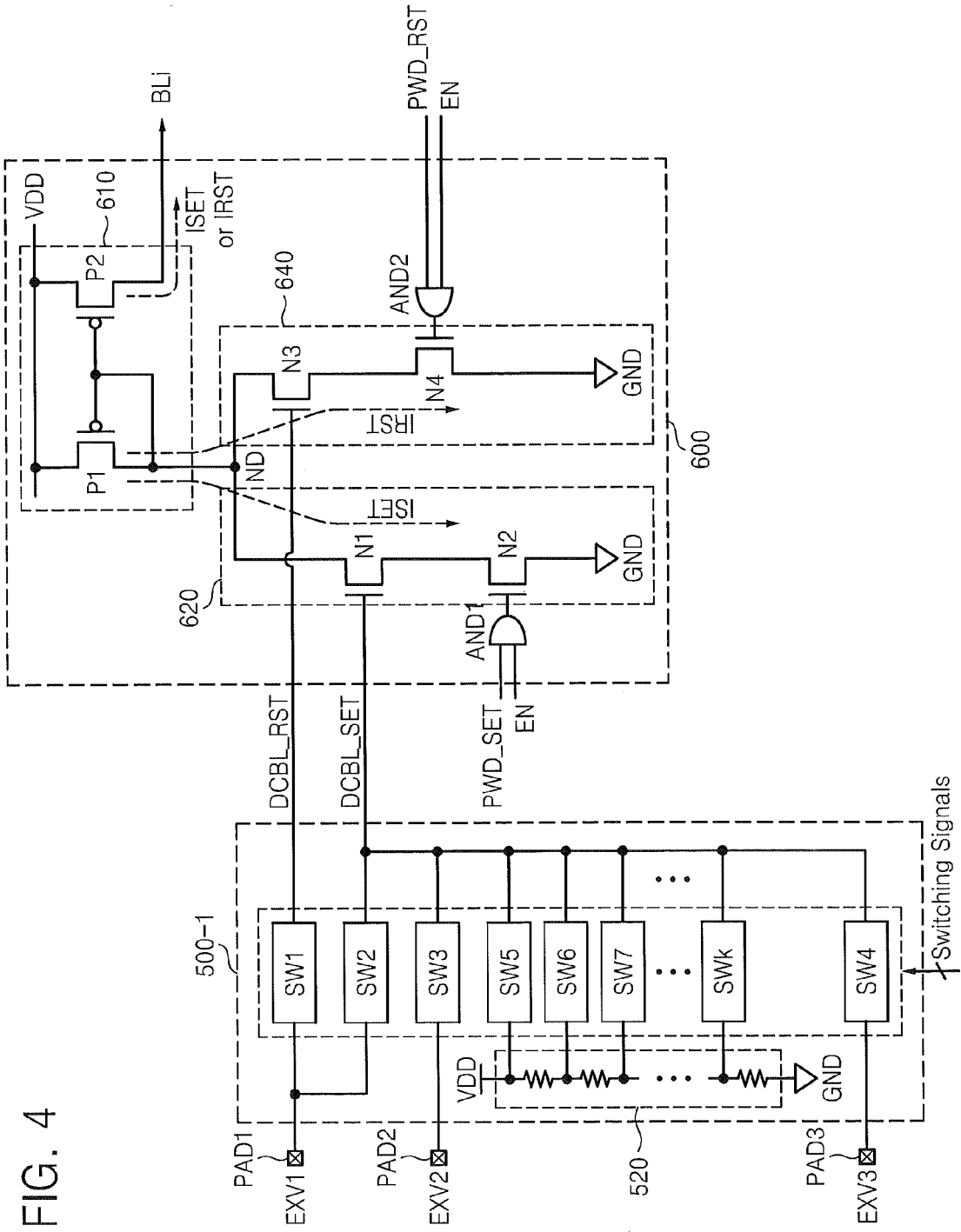
FIG. 4 illustrates a part of a pulse generator and a write driver illustrated in FIG. 1.

FIG. 4 illustrates a part of the pulse generator and a write driver illustrated in FIG. 1. Referring to FIGS. 1 and 4, a part 500-1 of the pulse generator 500 includes a voltage divider 520 and a plurality of switches SW1 to SWk. The voltage divider 520 includes a plurality of resistors connected in series between a power line supplying a supply voltage VDD and a reference signal line (e.g., ground line (GND)). The voltage divider 520 may output a plurality of voltages having a voltage level between the supply voltage VDD and the ground voltage. Each of the plurality of switches SW1 to SWk controls respective connections between each of the plurality of pads PAD1 to PAD3 and the write driver 600 and connections between nodes of the voltage divider 520 and the write driver 600 in response to each of a plurality of switching signals output from the switching signal generator 400. Thus, a first switch SW1 operating according to a corresponding switching signal is connected between a first pad PAD1 and a reset current branch 640 of the write driver 600 and controls connection between the first pad PAD1 and the write driver 600. A second switch SW2 is connected between the first pad PAD1 and a set current branch 620 of the write driver 600 and controls connection between the first pad PAD1 and the write driver 600. A third switch SW3 is connected between a second pad PAD2 and the set current branch 620 of the write driver 600 and controls connection between the second pad PAD2 and the write driver 600. Likewise, a fourth switch SW4 is connected between a third pad PAD3 and the set current branch 620 of the write driver 600 and controls connection between the third pad PAD3 and the write driver 600.

In addition, each of a fifth switch SW5 to a $k^{th}$ switch SWk is connected between nodes of the voltage divider 520 and the set current branch 620 of the write driver 600 and controls connection between the voltage divider 520 and the write driver 600. The write driver 600 includes: (i) a current mirror 610, (ii) the set current branch 620 for generating a set current ISET; and (iii) the reset current branch 640 for generating a reset current IRST. The current mirror 610 includes a first p-type metal-oxide semiconductor (PMOS) transistor P1 connected between a power line supplying (VDD) and a node ND and a second PMOS transistor P2 connected between the power line and a bit line BLi. The set current branch 620 includes n-type metal-oxide semiconductor (NMOS) transistors N1 and N2 connected in series in a totem-pole arrangement between the node ND and ground GND. An output terminal of an AND gate (AND1), which is responsive to a set pulse PWD_SET output from the pulse generator 500 and an enable signal EN output from the control logic 200, is connected to a gate of the NMOS transistor N2. A set bias voltage DCBL_SET output from the pulse generator 500 is supplied to a gate of NMOS transistor N1. When the set pulse PWD_SET and the enable signal EN are at a high level, a set current ISET, which is generated in the set current branch 620 in response to a set bias voltage DCBL_SET, is supplied to a bit line BLi ($1 \leq i \leq m$) through the current mirror 610. As a set current ISET is supplied to a memory element ME (e.g., a phase change material) of a resistive memory cell MC connected to the bit line BLi, the phase change material may store data corresponding to a set state.

The reset current branch 640 includes NMOS transistors N3 and N4 connected in series between the node ND and ground GND. An output terminal of an AND gate AND2, which his responsive to a reset pulse PWD_RST and the enable signal EN, is connected to a gate of NMOS transistor N4. A reset bias voltage DCBL_RST, which is output from the pulse generator 500, is supplied to a gate of an NMOS transistor N3. When the reset pulse PWD_RST and the enable signal EN are at a high level, a reset current IRST, which is generated in the reset current branch 640 in response to a reset bias voltage DCBL_RST, is supplied to the bit line BLi through the current mirror 610. As the reset current IRST is supplied to a memory element ME (e.g., a phase change material) of the resistive memory cell MC connected to the bit line BLi, the phase change material may store data corresponding to a reset state.

Accordingly, as described above with respect to FIGS. 1 and 4, a nonvolatile memory device 10 includes an array of resistive memory cells 100 arranged as a plurality of columns of memory cells electrically coupled to a plurality of bit lines BL1-BLm and a plurality of rows of memory cells electrically coupled to a plurality of word lines WL1-WLn. A write driver 600 is provided, which may be electrically connected to the bit lines in the array via a column selection circuit 380. The write driver 600 is configured to drive a selected one of the plurality of bit lines with a reset current pulse, which is responsive to a first external voltage EXV1 input through a first terminal/pad of the memory device during a memory cell reset operation. The write driver is further configured to drive the selected one of the plurality of bit lines in sequence with a first set current pulse, which is responsive to the first external voltage EXV1, and a second set current pulse, which is responsive to a second external voltage EXV2 input through a second terminal/pad of the memory device during a memory cell set operation. The write driver 600 includes a reset current generator 640 responsive to the first external voltage and a set current generator 620 responsive to the first and second external voltages. A pulse generator 500-1 is provided, which has a first switch SW1 connected in series between the first terminal (PAD1) and a first input of the reset current generator 640, a second switch SW2 connected in series between the first terminal (PAD1) and a first input of the set current generator 620 and a third switch SW3 connected in series between the second terminal (PAD2) and the first input of the set current generator 620. The pulse generator 500-1 includes a voltage divider 520, which is configured to generate a plurality of unequal voltages at respective nodes therein, and a plurality of switches SW5-SWk, which are configured to pass the plurality of unequal voltages one-at-a-time to the first input of the set current generator 620 during the memory cell set operation. The plurality of switches SW1-SWk may be normally-open switches and the pulse generator 500-1 may be configured to sequentially close the plurality of switches one-at-a-time during the memory cell set operation. The write driver 600 may also include a current mirror 610 and the reset current generator 640 and the set current generator 620 may be commonly connected to a first node ND of the current mirror 610. Moreover, the write driver 600 may be configured to electrically connect a second node of the current mirror 610 to the selected one of the plurality of bit lines during the memory cell reset operation.

Figure 5:
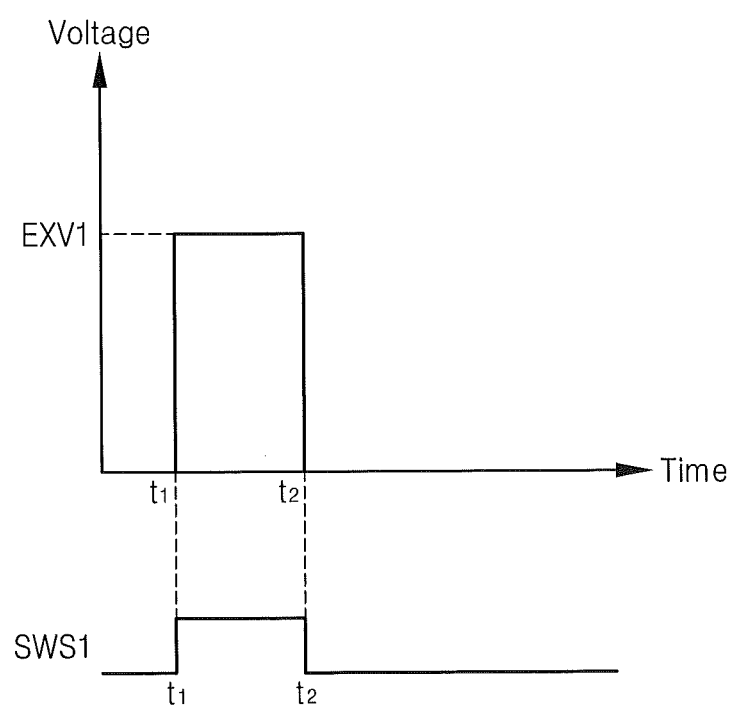
FIG. 5 is a drawing for explaining a generation process of a reset bias voltage output from the pulse generator illustrated in FIG. 1.

FIG. 5 is a drawing for explaining a generation process of a reset bias voltage output from the pulse generator illustrated in FIG. 1. Referring to FIGS. 1, 4, and 5, a first switching signal SWS1 for controlling an operation of a first switch SW1 is activated to be at a high level at a time point t1 and de-activated to be at a low level at a time point t2. In response to the first switching signal SWS1, the first switch SW1 is turned on at a time point t1 and turned off at a time point t2. Accordingly, a voltage level of a reset bias voltage DCBL_RST output from the pulse generator 500 between time points t1 and t2 is the same as a voltage level of a first external voltage EXV1.

Figure 6:
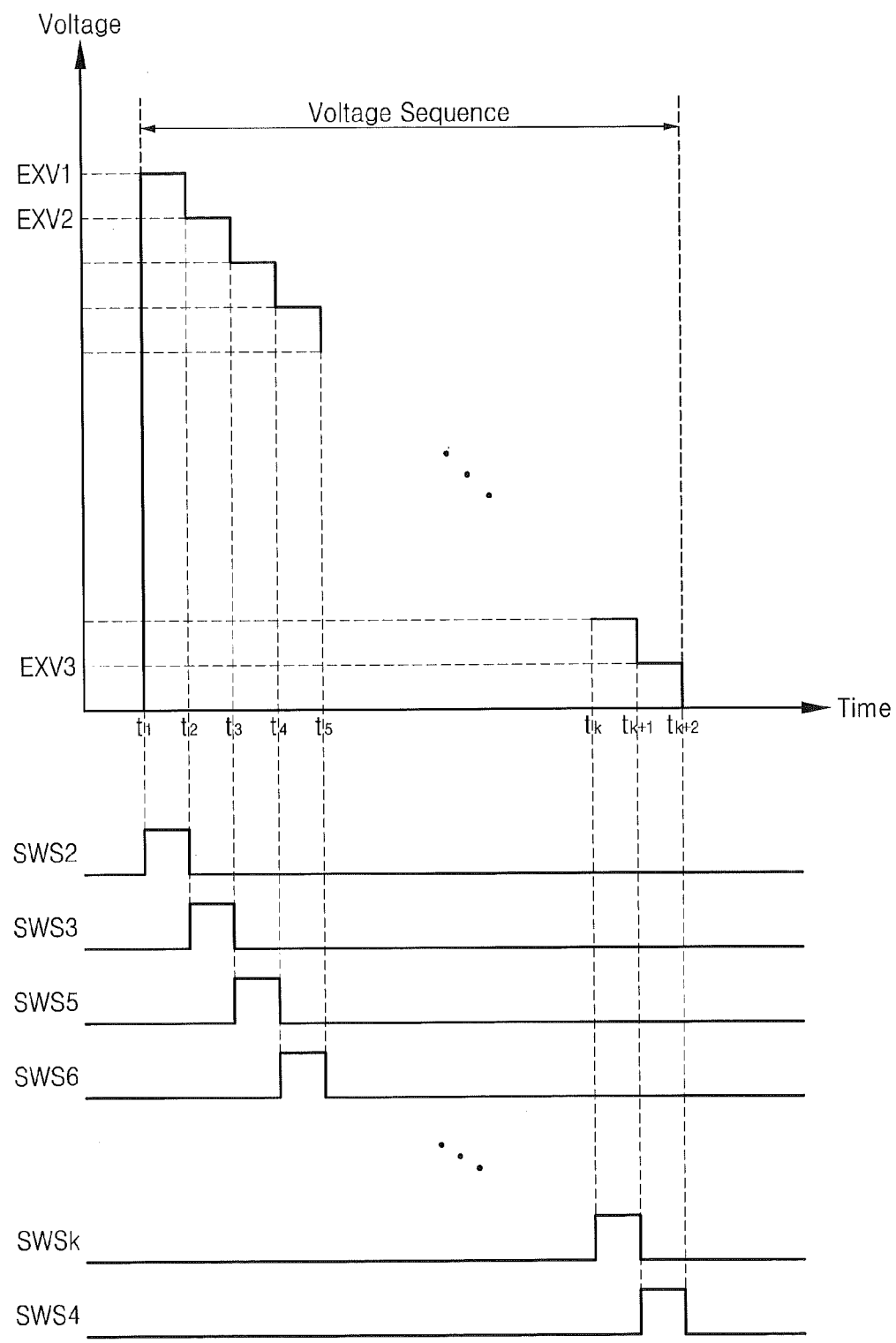
FIG. 6 is a drawing for explaining a generation process of a set bias voltage output from the pulse generator illustrated in FIG. 1.

FIG. 6 is a drawing for explaining a generation process of a set bias voltage output from the pulse generator illustrated in FIG. 1. Referring to FIGS. 1, 4, and 6, a set bias voltage DCBL_SET has a waveform of a step-down type where a voltage level decreases successively. That is, a voltage level of a first external voltage EXV1 is higher than a voltage level of a second external voltage EXV2, and the voltage level of the second external voltage EXV2 is higher than a voltage level of a third external voltage EXV3. A second switching signal SWS2 for controlling an operation of a second switch SW2 is activated at t1 and de-activated at t2. In response to the second switching signal SWS2, the second switch SW2 is turned on at t1 and turned off at t2. Accordingly, a voltage level of a set bias voltage DCBL_SET output from the pulse generator 500 between t1 and t2 is the same as the voltage level of the first external voltage EXV1.

A third switching signal SWS3 for controlling an operation of a third switch SW3 is activated at t2 and de-activated at t3. In response to the third switching signal SWS3, the third switch SW3 is turned on at t2 and turned off at t3. Accordingly, a voltage level of a set bias voltage DCBL_SET between t2 and t3 is the same as a voltage level of the second external voltage EXV2. Each of a fifth switching signal SWS5 to a $k^{th}$ switching signal SWSk has a successive activation interval between t3 and tk+1. Each of a fifth switch SW5 to a $k^{th}$ switch SWk is turned on or off in response to each of the fifth switching signal SWS5 to the $k^{th}$ switching signal SWSk. Accordingly, a voltage level of the set bias voltage DCBL_SET between t3 and tk+1 decreases successively between a supply voltage VDD and a ground voltage GND. Here, a voltage level of the set bias voltage DCBL_SET according to a turn-on operation of the fifth switch SW5 is smaller than the voltage level of the second external voltage EXV2.

A fourth switching signal SWS4 for controlling an operation of a fourth switch SW4 is activated at tk+1 and de-activated at tk+2. In response to the fourth switching signal SWS4, the fourth switch SW4 is turned on at tk+1 and turned off at tk+2. Accordingly, a voltage level of the set bias voltage DCBL_SET between tk+1 and tk+2 is the same as a voltage level of the third external voltage EXV3. Here, the voltage level of the third external voltage EXV3 is smaller than a voltage level of the set bias voltage DCBL_SET according to a turn-on operation of the $k^{th}$ switch SWk.

Figure 7:
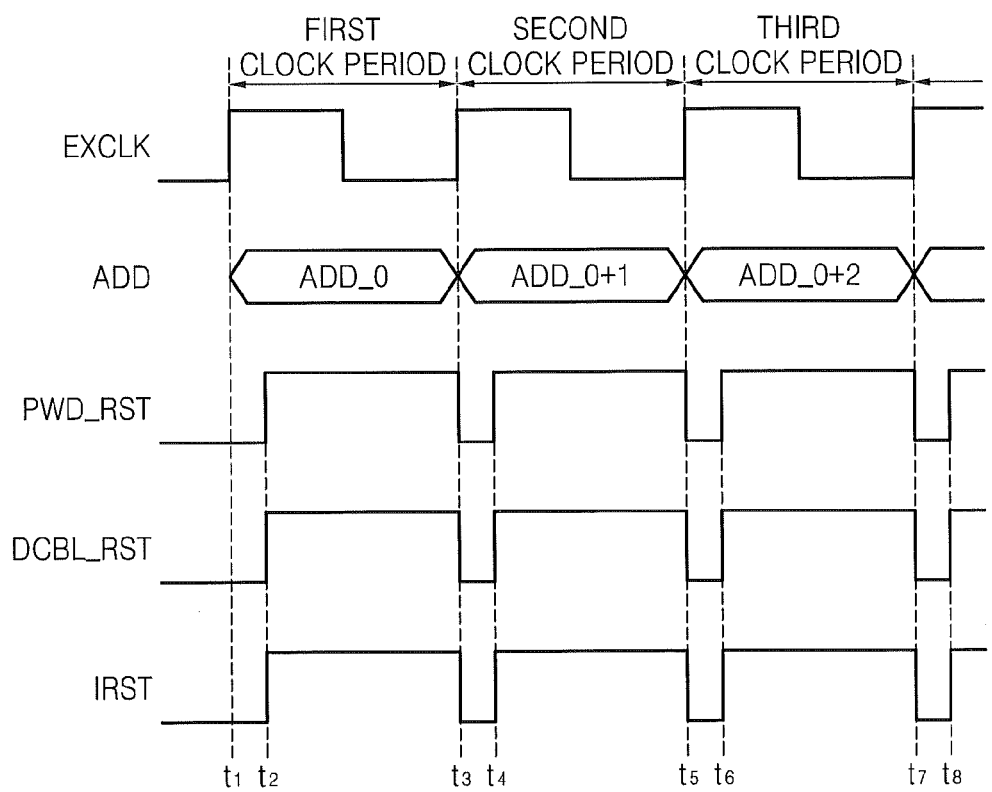
FIGS. 7 and 8 are timing diagrams for explaining a test operation of the resistive memory device illustrated in FIG. 1.
Figure 8:
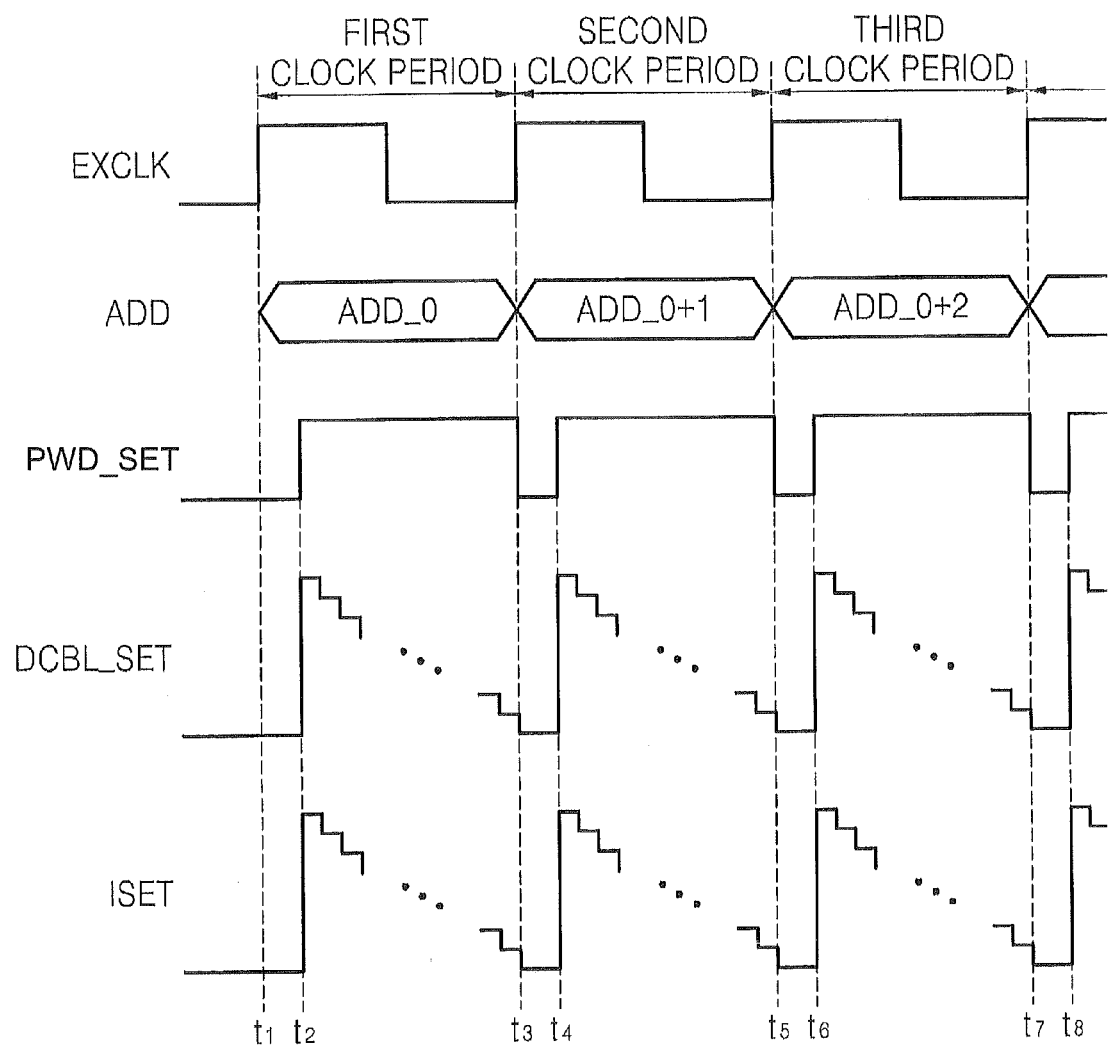

FIGS. 7 and 8 are timing diagrams for explaining a test operation of the resistive memory device illustrated in FIG. 1. FIG. 7 is a timing diagram for explaining a reset operation during the test operation and FIG. 8 is a timing diagram for explaining a set operation during the test operation. Referring to FIGS. 1 and 7, an external clock EXCLK has a first clock period between time points t1 and t3. A counter block 300 outputs a first address ADD_0 during the first clock period. After the first address ADD_0 is generated, the pulse generator 500 outputs a reset pulse PWD_RST and a reset bias voltage DCBL_RST which are activated between time points t2 and t3. A write driver 600 supplies a reset current IRST to a resistive memory cell corresponding to the first address ADD_0 between t2 and t3 in response to the reset pulse PWD_RST and the reset bias voltage DCBL_RST. The external clock EXCLK has a second clock period between time points t3 and t5. The counter block 300 outputs a second address ADD_1 during the second clock period. After the second address ADD_1 is generated, the pulse generator 500 outputs a reset pulse PWD_RST and a reset bias voltage DCBL_RST which are activated between time points t4 and t5. The write driver 600 supplies a reset current IRST to a resistive memory cell corresponding to the second address ADD_1 between time points t4 and t5 in response to the reset pulse PWD_RST and the reset bias voltage DCBL_RST.

As the counter block 300 outputs addresses in an increasing succession, the write driver 600 may supply a reset current IRST to each of the plurality of resistive memory cells MC. In this process, there may be a delay operation among the reset pulse PWD_RST, the reset bias voltage DCBL_RST and the reset current IRST. However, the delay operation is not considered.

Referring to FIGS. 1 and 8, the external clock EXCLK has a first clock period between time points t1 and t3. The counter block 300 outputs a first address ADD_0 during the first clock period. After the first address ADD_0 is generated, the pulse generator 500 outputs a set pulse PWD_SET, which is activated between time points t2 and t3. Moreover, the pulse generator 500 outputs a set bias voltage DCBL_SET which is stepped-down between time points t2 and t3. The write driver 600 supplies a set current ISET to a resistive memory cell corresponding to the first address ADD_0 between time points t2 and t3 in response to the set pulse PWD_SET and the set bias voltage DCBL_SET.

The external clock EXCLK has a second clock period between time points t3 and t5. The counter block 300 outputs a second address ADD_1 during the second clock period. After the second address ADD_1 is generated, the pulse generator 500 outputs a set pulse PWD_SET which is activated between time points t4 and t5. Moreover, the pulse generator 500 outputs a set bias voltage DCBL_SET which is step-downed between time points t4 and t5. The write driver 600 supplies a set current ISET to a resistive memory bell corresponding to the second address ADD_1 between time points t4 and t5 in response to the set pulse PWD_SET and the set bias voltage DCBL_SET. As the counter block 300 outputs addresses in an increasing sequence, the write driver 600 may supply the set current ISET to each of the plurality of resistive memory cells MC.

Figure 9:
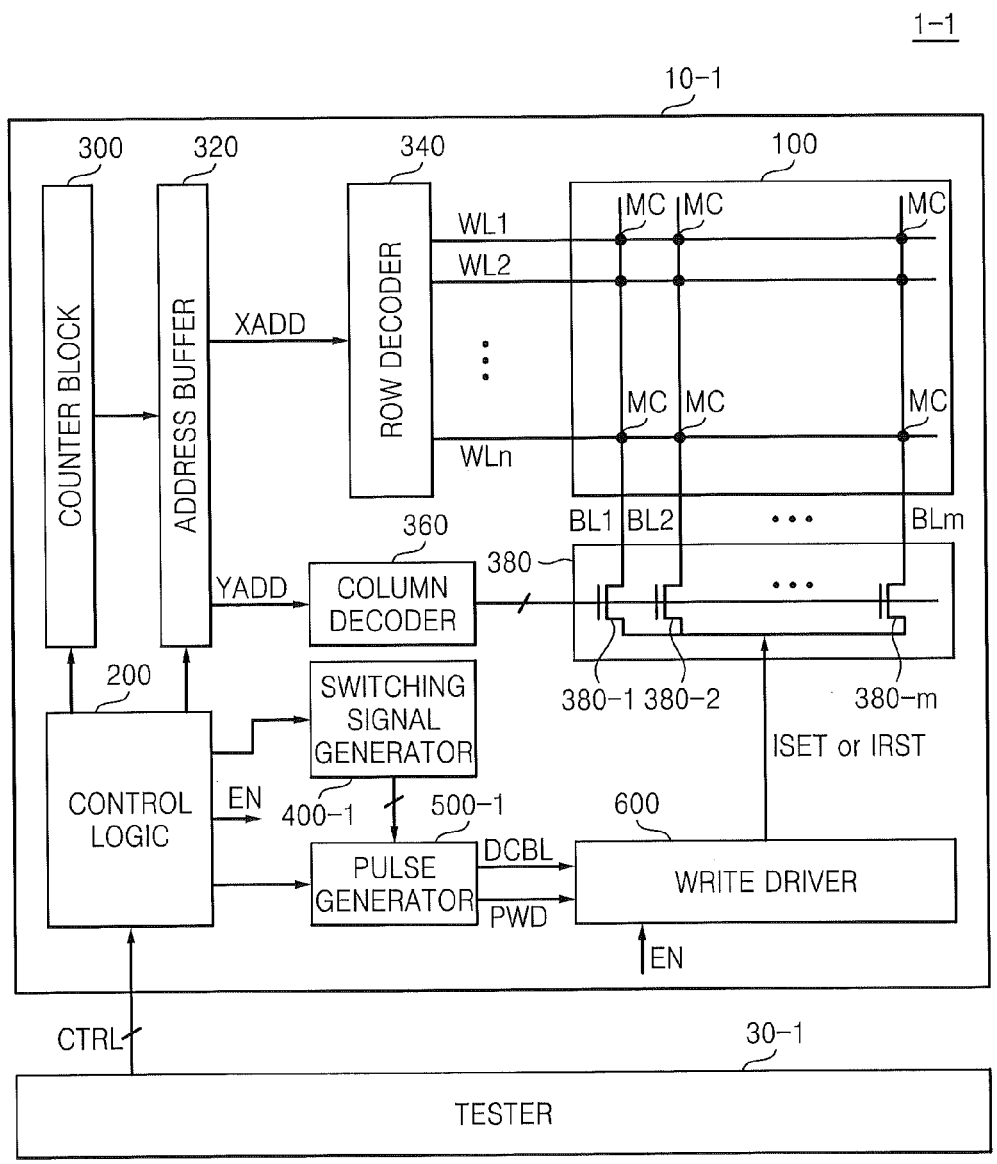
FIG. 9 is a block diagram of a system including a resistive memory device and a tester according to another example embodiment of the present invention.

FIG. 9 is a block diagram of a system including a resistive memory device and a tester according to another example embodiment of the present invention. Referring to FIG. 9, a system 1-1 includes a resistive memory device 10-1 and a tester 30-1. The resistive memory device 10-1 includes a memory cell array 100, a control logic 200, a counter block 300, an address buffer 320, a row decoder 340, a column decoder 360, a selection circuit 380, a switching signal generator 400-1, a pulse generator 500-1, and a write driver 600. The control logic 200 may control an operation of the counter block 300, the address buffer 320, the row decoder 340, the column decoder 360 and the write driver 600 to test each of the plurality of resistive memory cells MC under a control of the tester 30-1 during a test operation. That is, the control logic 200 may control a general operation of the resistive memory device 10-1. The switching signal generator 400-1 may output a plurality of switching signals for controlling each switching operation of a plurality of switches included in the pulse generator 500-1 under a control of the control logic 200. Each of the plurality of switching signals is generated based on a trimming value and a MRS code. That is, the switching signal generator 400-1 may generate the plurality of switching signals by performing an arithmetic operation on the trimming value and the MRS code. The trimming value includes information on a voltage level or width of a bias voltage during a normal operation. Although semiconductor chips are manufactured through an identical process, each electrical property of the semiconductor chips is not the same. That is, although a bias voltage having an identical voltage level is supplied to each of the semiconductor chips, current levels of each program current of the semiconductor chips do not have an identical value. Accordingly, information on a bias voltage where each of the semiconductor chips may exert an optimum performance may be stored as a trimming value. Each semiconductor chip may have a different trimming value. The trimming value may be stored in advance in a first storage unit included in the switching signal generator 400-1. The first storage unit may be embodied in a plurality of fuses (e.g., laser fuses or electrical fuses (e-fuses)). The trimming value may be stored in the plurality of fuses by cutting or uncutting each of the plurality of fuses.

The MRS code includes information on a voltage level difference or width difference between the bias voltage during the normal operation and a bias voltage during a test operation. Accordingly, the switching signal generator 400-1 or the resistive memory device 10-1 may further include a second storage unit for storing the MRS code. The second storage unit may be embodied in a MRS. The MRS code may be supplied from the tester 30-1.

The pulse generator 500-1 generates a program pulse PWD and a bias voltage DCBL in response to control signals output from the control logic 200 and a plurality of switching signals output from the switching signal generator 400, and outputs the generated program pulse PWD and bias voltage DCBL to the write driver 600. Here, the program pulse PWD includes a set pulse and a reset pulse. In addition, the bias voltage DCBL includes a set bias voltage and a reset bias voltage. The pulse generator 500-1 includes a set bias voltage generator and a reset bias voltage generator. The set bias voltage generator may output the set bias voltage and the reset bias voltage generator may output the reset bias voltage. The tester 30-1 may test each of the plurality of resistive memory cells MC included in the memory cell array 100 of the resistive memory device 10-1. The tester 30 supplies a plurality of control signals to the control logic 200 included in the resistive memory device 10-1 during a test operation.

Figure 10:
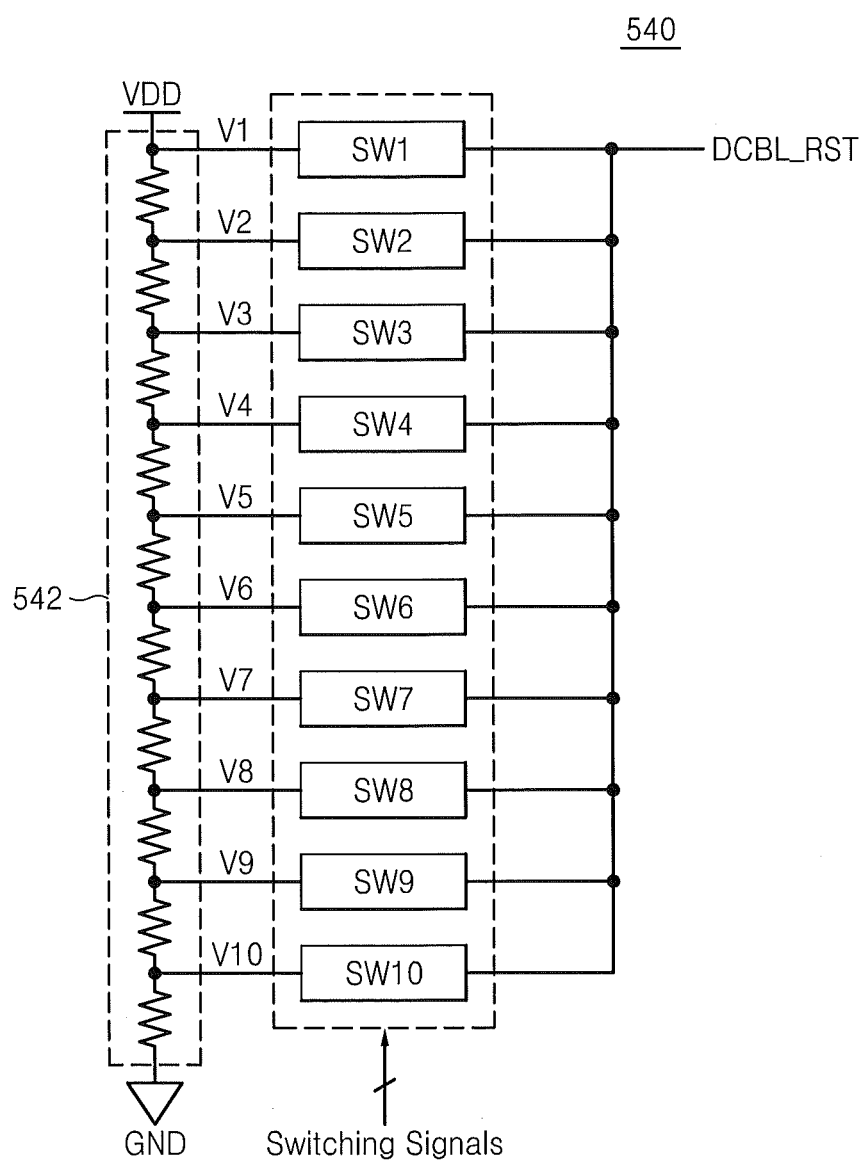
FIG. 10 is a circuit diagram of a reset bias voltage generator included in a pulse generator illustrated in FIG. 9.

FIG. 10 is a circuit diagram of a reset bias voltage generator included in the pulse generator illustrated in FIG. 9. Referring to FIGS. 9 and 10, the reset bias voltage generator 540 includes a voltage divider 542 and a plurality of switches SW1 to SW10. FIG. 9 illustrates ten switches. However, the present invention is not restricted thereto and the number of the plurality of switches may change. The voltage divider 542 includes a plurality of resistors connected in series between a power line supplying a supply voltage VDD and a ground GND. Each of the plurality of switches SW1 to SW10 is connected between each of a plurality of nodes included in the voltage divider 542 and the write driver 600. Accordingly, each of the plurality of switches SW1 to SW10 may control connection between each of the plurality of nodes and the write driver 600 in response to each of a plurality of switching signals output from the switching signal generator 400-1, and the reset bias voltage generator 540 may output one of a plurality of voltages V1 to V10 as a reset bias voltage DCBL_RST. The set bias voltage generator may be embodied in the same configuration as the reset bias voltage generator 540.

Figure 11:
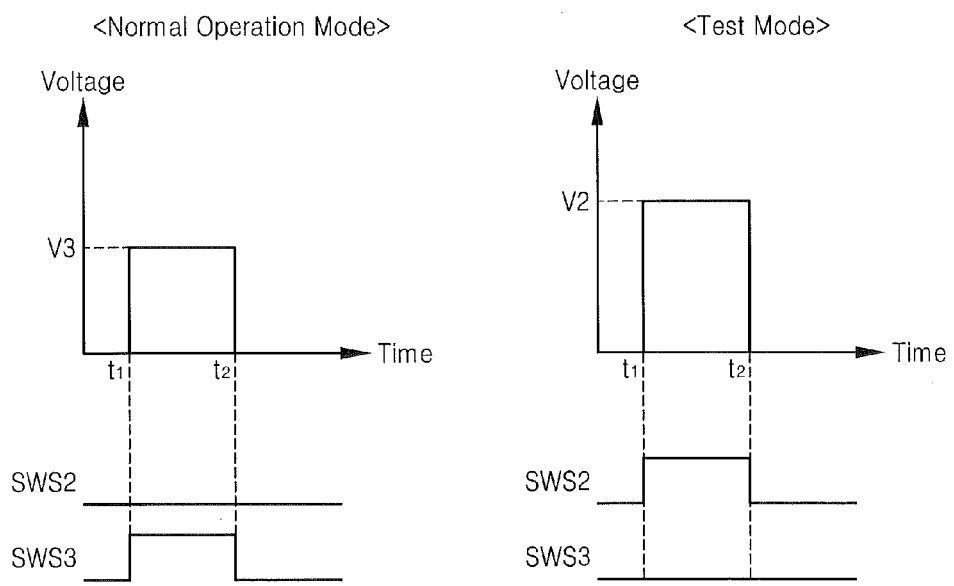
FIG. 11 is a drawing for explaining a generation process of a reset bias voltage output from the reset bias voltage generator illustrated in FIG. 10.

FIG. 11 is a drawing for explaining a generation process of a reset bias voltage output from the reset bias voltage generator illustrated in FIG. 10. Referring to FIGS. 9 to 11, a switching signal generator 400-1 in a normal operation mode outputs a third switching signal SWS3, which has an activation interval between t1 and t2 based on a trimming value. However, the switching signal generator 400-1 in a test mode outputs a second switching signal SWS2, which has an activation interval between t1 and t2, based on the trimming value and a MRS code. At last, while a voltage level of a reset bias voltage in the normal operation mode is V3, a voltage level of a reset bias voltage in the test mode is V2. That is, the resistive memory device 10-1 may output the reset bias voltage having a level higher than the V3 in a test mode.

Figure 12:
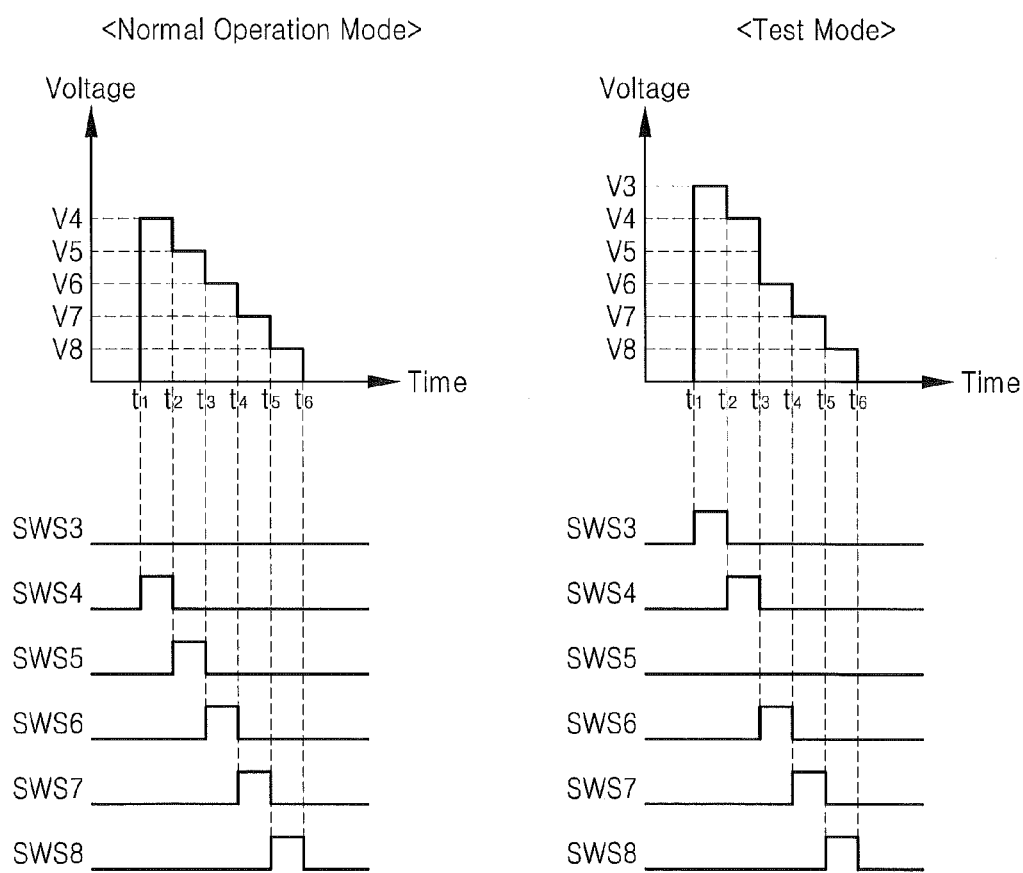
FIG. 12 is a drawing for explaining a generation process of a set bias voltage output from a set bias voltage generator included in a pulse generator illustrated in FIG. 9.

FIG. 12 is a drawing for explaining a generation process of a set bias voltage output from a set bias voltage generator included in the pulse generator illustrated in FIG. 9. It is assumed that a set bias voltage generator is illustrated in FIG. 10 below. Referring to FIGS. 9, 10 and 12, the switching signal generator 400-1 in a normal operation mode, based on a trimming value, outputs a fourth switching signal SWS4 to an eighth switching signal SWS8 each having an activation interval successively between t1 and t6. Accordingly, a set bias voltage in a normal operation mode is step-downed from a voltage level V4 to a voltage level V8. However, the switching signal generator 400-1 in a test mode outputs a third switching signal SWS3 having an activation interval between t1 and t2 based on the trimming value and a MRS code. Accordingly, between t1 and t2, a voltage level of a set bias voltage DCBL_SET in the test mode is V3. The switching signal generator 400-1 outputs a fourth switching signal SWS4 having an activation interval between t2 and t3. Accordingly, between t2 and t3, a voltage level of the set bias voltage DCBL_SET in the test mode is V4. Likewise, the switching signal generator 400-1 outputs a sixth switching signal SWS6 to an eighth switching signal SWS8 which have an activation interval successively between t3 and t6. Accordingly, between t3 and t6, a voltage level of the set bias voltage DCBL_SET in the test mode is step-downed from V6 to V8.

Figure 13:
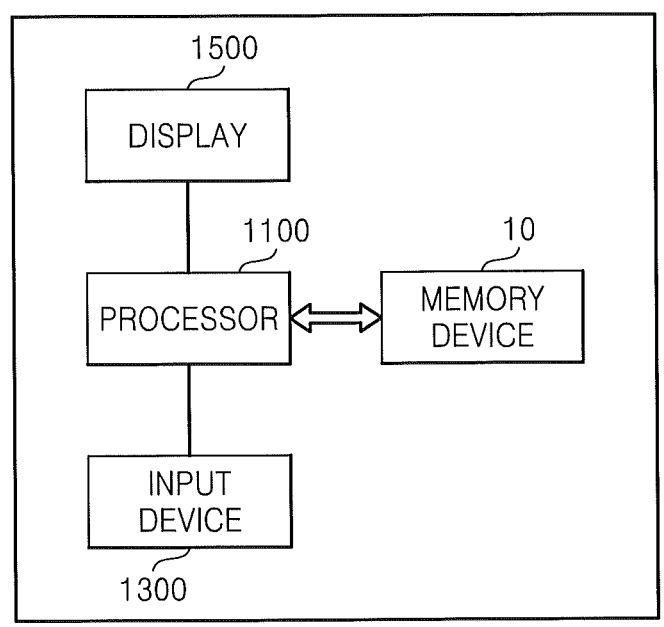
FIG. 13 is a block diagram of a memory system including the resistive memory device illustrated in FIG. 1.

FIG. 13 is a block diagram of a memory system including the resistive memory device illustrated in FIG. 1. Referring to FIGS. 1 and 13, a memory system 1000 may be embodied in a data processing device such as a tablet computer, a net-book, an e-reader, a personal digital assistant (PDA), a portable multimedia player (PMP), a MP3 player, a mobile phone, a smart phone, a wireless internet device, or a MP4 player. The memory system 1000 includes a resistive memory device 10, which may store a program bit, and a processor 1100, which may control a data processing operation of the resistive memory device 10. The processor 1100 may display data stored in the resistive memory device 10 through a display 1500 according to an input signal generated by an input device 1300. For example, the input device 1300 may be embodied in a pointing device such as a touch pad or a computer mouse, a keypad, or a keyboard.

Figure 14:
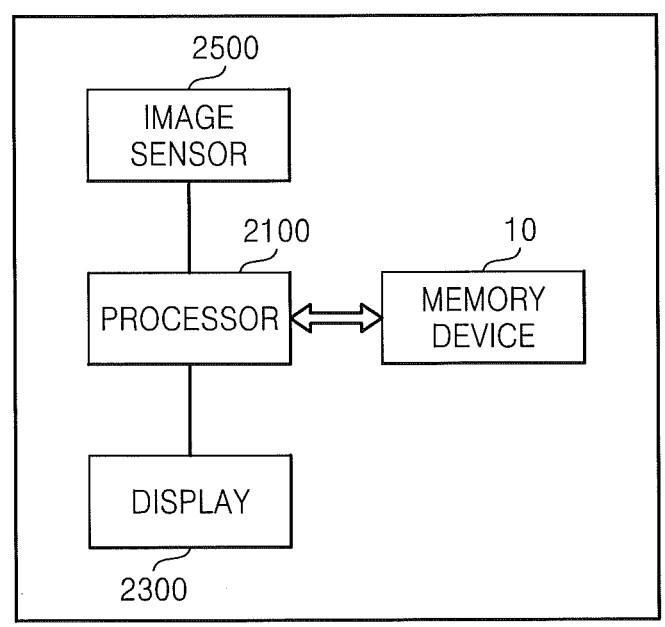
FIG. 14 is another example embodiment of the memory system including the resistive memory device illustrated in FIG. 1.

FIG. 14 is another example embodiment of a memory system including a resistive memory device illustrated in FIG. 1. Referring to FIGS. 1 and 14, the memory system 2000 may be embodied in a digital camera or a digital camera-equipped mobile phone. The memory system 2000 includes the resistive memory device 10, which may store a program bit, and a processor 2100, which may control a data processing operation of the resistive memory device 10. An image sensor 2500 of the memory system 2000 converts an optical image into digital signals, and the converted digital signals are stored in the resistive memory device 10 under a control of the processor 2100 or displayed through a display 2300. In addition, the digital signals stored in the resistive memory device 10 are displayed through the display 2300 under a control of the processor 2100.

Figure 15:
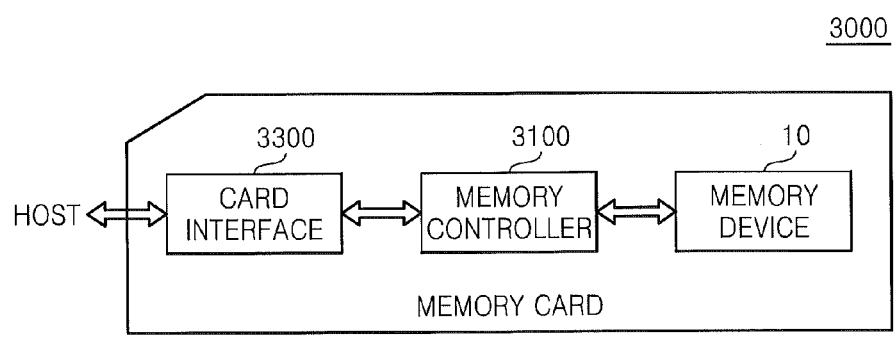
FIG. 15 is still another example embodiment of the memory system including the resistive memory device illustrated in FIG. 1.

FIG. 15 is still another example embodiment of a memory system including a resistive memory device illustrated in FIG. 1. Referring to FIGS. 1 and 15, the memory system 3000 may be embodied in a memory card or a smart card. The memory system 3000 includes the resistive memory device 10, a memory controller 3100, and a card interface 3300. The memory controller 3100 may control data exchange between the resistive memory device 10 and the card interface 3300.

According to an example embodiment, the card interface 3300 may be a secure digital (SD) card interface or a multimedia card (MMC) interface. However, the present invention is not restricted thereto. The card interface 3300 may interface data exchange between a host and the memory controller 3100 according to a protocol of the host. For example, when the memory system 3000 is connected to a host such as a computer, a digital camera, a digital audio player, a mobile phone, console video game hardware, or a digital set-top box, the host may transmit or receive data stored in the resistive memory device 10 through the card interface 3300 and the memory controller 3100.

A resistive memory device according to an example embodiment of the present invention may supply a program current in response to each of external voltages input through each of a plurality of pads, so that it may improve a voltage driving capability or a current driving capability of the resistive memory device. In addition, a resistive memory device of the present invention may test a plurality of chips at the same time by generating successively increasing addresses inside without using each address pin of the plurality of chips during a test operation.

Moreover, a resistive memory device of the present invention may screen defect related to the set operation by including a set operation during a test operation. Although a few embodiments of the present general inventive concept have been shown and described, it will be appreciated by those skilled in the art that changes may be made in these embodiments without departing from the principles and spirit of the general inventive concept, the scope of which is defined in the appended claim's and their equivalents.

What is claimed is:

1. A nonvolatile memory device, comprising:
 an array of resistive memory cells electrically coupled to a plurality of bit lines;
 a write driver configured to drive a selected one of the plurality of bit lines with a reset current pulse responsive to a first external voltage input through a first terminal of the memory device during a memory cell reset operation and further configured to drive the selected one of the plurality of bit lines in sequence with a first set current pulse responsive to the first external voltage and a second set current pulse responsive to a second external voltage input through a second terminal of the memory device during a memory cell set operation, said write driver comprising a reset current generator responsive to the first external voltage and a set current generator responsive to the first and second external voltages; and
 a pulse generator having first switch connected in series between the first terminal and a first input of the reset current generator, a second switch connected in series between the first terminal and a first input of the set current generator and a third switch connected in series between the second terminal and the first input of the set current generator.

2. The memory device of claim 1, wherein said pulse generator further comprises:
 a voltage divider configured to generate a plurality of unequal voltages at respective nodes therein; and
 a plurality of switches configured to pass the plurality of unequal voltages one-at-a-time to the first input of the set current generator during the memory cell set operation.

3. The memory device of claim 2, wherein the plurality of unequal voltages are less than a magnitude of the second external voltage.

4. The memory device of claim 3, wherein the plurality of switches are normally-open switches; and wherein said pulse generator is configured to sequentially close the plurality of switches one-at-a-time during the memory cell set operation.

5. The memory device of claim 4, wherein said write driver comprises a current mirror; and wherein the reset current generator and the set current generator are commonly connected to a first node of the current mirror.

6. The memory device of claim 5, wherein said write driver is configured to electrically connected a second node of the current mirror to the selected one of the plurality of bit lines during the memory cell reset operation.

7. The memory device of claim 1, wherein said write driver comprises a current mirror; and wherein the reset current generator and the set current generator are commonly connected to a first node of the current mirror.

8. The memory device of claim 7, wherein said write driver is configured to electrically connected a second node of the current mirror to the selected one of the plurality of bit lines during the memory cell reset operation.

9. A resistive memory device, comprising:
 a resistive memory cell connected between a word line and a bit line;
 a write driver, which supplies a reset current pulse to the bit line in response to a first external voltage input through a first pad during a reset operation, supplies a first set current pulse to the bit line in response to the first external voltage input through the first pad and supplies a second set current pulse to the bit line in response to a second external voltage input through a second pad during a set operation;
 a first switch connected between the first pad and a reset current branch of the write driver;
 a second switch connected between the first pad and a set current branch of the write driver; and
 a third switch connected between the second pad and the set current branch of the write driver.

10. The resistive memory device of claim 9, further comprising a mode register set (MRS) which controls each switching operation of the first switch to the third switch.

11. The resistive memory device of claim 9, wherein the resistive memory cell is a phase change memory (PRAM) cell.

12. A resistive memory device comprising:

a plurality of resistive memory cells;

a write driver, which supplies a reset current pulse to each bit line of the plurality of resistive memory cells successively in response to a first external voltage input through a first pad during a reset operation, and supplies a set current pulse sequence including a first set current pulse, generated in response to the first external voltage input through the first pad, and a second set current pulse, generated in response to a second external voltage input through a second pad, to the each bit line of the plurality of resistive memory cells successively during a set operation;

a first switch connected between the first pad and a reset current branch of the write driver;

a second switch connected between the first pad and a set current branch of the write driver; and a third switch connected between the second pad and the set current branch of the write driver.

13. The resistive memory device of claim 12, further comprising:

a counter block outputting addresses increasing successively;

a row decoder successively selecting each of word lines connected to each of the plurality of resistive memory cells in response to the addresses; and a column decoder selecting each of the plurality of bit lines successively in response to the addresses.

* * * * *